US012040033B2

(12) United States Patent
Berman

(10) Patent No.: US 12,040,033 B2
(45) Date of Patent: Jul. 16, 2024

(54) ECC BUFFER REDUCTION IN A MEMORY DEVICE

(71) Applicant: SAMSUNG ELECTRONICS CO., LTD., Suwon-si (KR)

(72) Inventor: Amit Berman, Binyamina (IL)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/295,130

(22) Filed: Apr. 3, 2023

(65) Prior Publication Data
US 2023/0238074 A1    Jul. 27, 2023

Related U.S. Application Data

(62) Division of application No. 17/223,375, filed on Apr. 6, 2021, now Pat. No. 11,636,912.

(51) Int. Cl.
| | | |
|---|---|---|
| *G11C 29/40* | (2006.01) | |
| *G11C 7/10* | (2006.01) | |
| *G11C 29/42* | (2006.01) | |
| *G11C 29/44* | (2006.01) | |

(52) U.S. Cl.
CPC ............ *G11C 29/42* (2013.01); *G11C 7/1039* (2013.01); *G11C 29/40* (2013.01); *G11C 29/44* (2013.01)

(58) Field of Classification Search
CPC ....... G11C 29/42; G11C 7/1039; G11C 29/40; G11C 29/44
USPC ..................................................... 365/185.09
See application file for complete search history.

(56) References Cited

U.S. PATENT DOCUMENTS

| | | | | |
|---|---|---|---|---|
| 2010/0281340 A1* | 11/2010 | Franceschini | ........ | G11C 16/349 714/763 |
| 2011/0320913 A1* | 12/2011 | Stracovsky | ............. | H03M 7/30 714/763 |
| 2012/0317334 A1* | 12/2012 | Suzuki | ................ | G06F 12/0246 711/E12.008 |
| 2013/0246721 A1* | 9/2013 | Fukutomi | ............. | G06F 3/0679 711/155 |
| 2014/0026013 A1* | 1/2014 | Koseki | ................ | G06F 11/1068 714/764 |
| 2014/0149827 A1 | 5/2014 | Kim et al. | | |
| 2015/0100848 A1 | 4/2015 | Kalamatianos et al. | | |
| 2017/0317695 A1* | 11/2017 | Marchand | .......... | H03M 13/1171 |
| 2018/0076828 A1* | 3/2018 | Kanno | ................... | G11C 16/10 |
| 2018/0088812 A1* | 3/2018 | Lee | .......................... | G06F 3/064 |

(Continued)

OTHER PUBLICATIONS

Arnold J. Niessen et al., "Memory Hardware Support for Sparse Computations", Proceedings of the Twenty-Seventh Annual Hawaii International Conference on System Sciences, 1994.

(Continued)

*Primary Examiner* — Ly D Pham
(74) *Attorney, Agent, or Firm* — F. Chau & Associates, LLC

(57) ABSTRACT

A memory system includes a memory device and a memory controller. The memory device includes a plurality of memory cells. The memory controller includes an error correction code (ECC) circuit. The ECC circuit is configured to determine data rows of first write data that are not all zeros and store the determined data rows in buffer rows of a buffer along with corresponding row indexes. The memory controller is configured to write second data based on the buffer to the memory device.

16 Claims, 19 Drawing Sheets

(56) References Cited

U.S. PATENT DOCUMENTS

| | | | |
|---|---|---|---|
| 2019/0087115 A1* | 3/2019 | Li | G06F 11/1048 |
| 2021/0208967 A1 | 7/2021 | Cha et al. | |
| 2021/0255808 A1* | 8/2021 | Alameldeen | G06F 11/1012 |
| 2021/0278998 A1* | 9/2021 | Li | G06F 12/0246 |
| 2022/0319623 A1 | 10/2022 | Berman | |

OTHER PUBLICATIONS

ECC memory, Wikipedia, Mar. 27, 2021.
Sparsh Mittal et al., "A Survey of Architectural Approaches for Data Compression in Cache and Main Memory Systems", IEEE Transactions on Parallel and Distributed Systems, vol. 27, No. 5, May 2016.
List of references on Dec. 22, 2022.

* cited by examiner

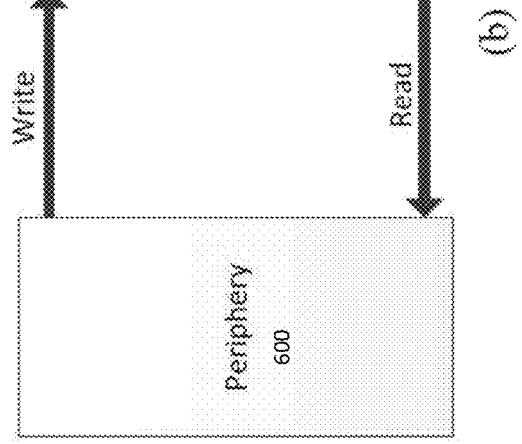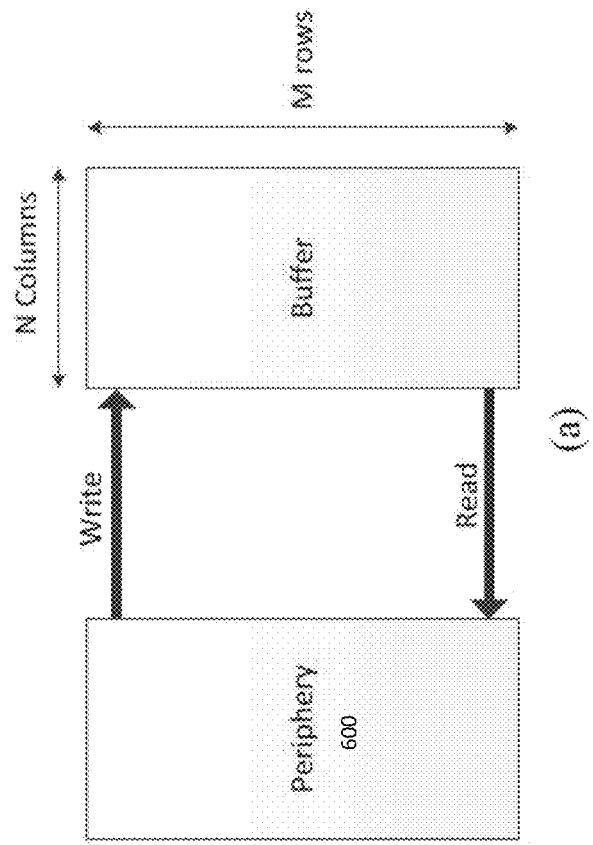
FIG. 6B

FIG. 7A

Algorithm 1:   Row Encoding

*Compressor*
(1) j←1
(2) For input rows i=1 to M
(3)   If row is not all-zeros
(4)     store row with index i in new-Matrix row j
(5)     j←j+1
(6)   End If
(7) End For

*De-Compressor*
(1) j←1
(2) stored_row ← read row j from new-Matrix
(3) For input rows i=1 to M
(4)   If stored_row index=i
(5)     output stored_row data
(6)     j←j+1
(7)     stored_row ← read row j from new-Matrix
(8)   Else
(9)     output all-zero vector
(10)  End If
(11)End For

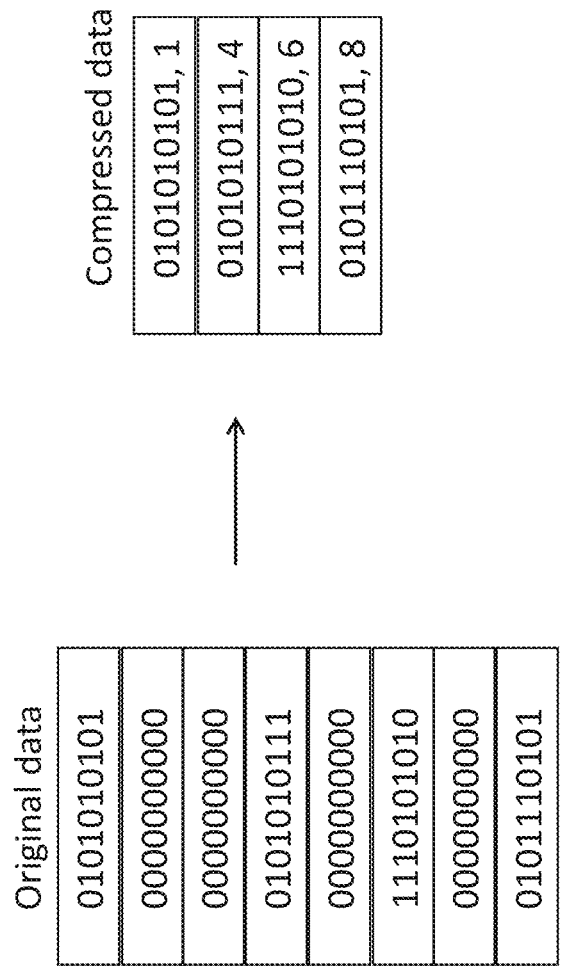

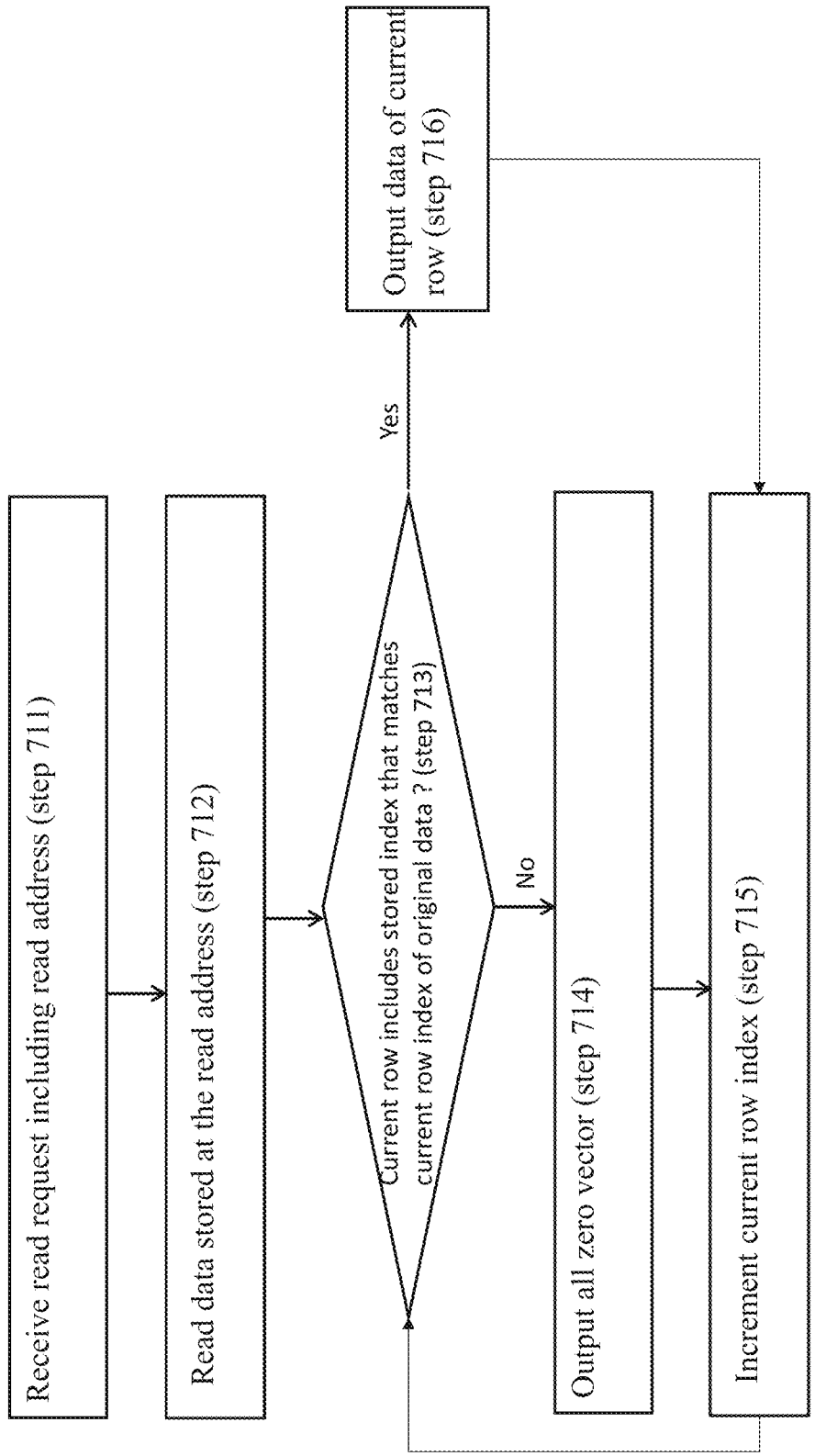

FIG. 8A

Algorithm 2: Snapshot Window Encoding

*Compressor*
(1) matrix_num ← 1; row_num ← 1;
(2) For input rows i=1 to M
(3) Divide row to vectors of size w
(4) For sub-row vectors wi=1 to N/w
(5) If vector is not all-zeros
(6) store vector with indices (i,wi) in Martix: matrix_num at row: row_num
(7) matrix_num ← matrix_num+1
(8) If matrix_num>N/w
(9) matrix_num ← 1; row_num ← row_num+1;
(10) End If
(11) End If
(12) End For
(13) End For

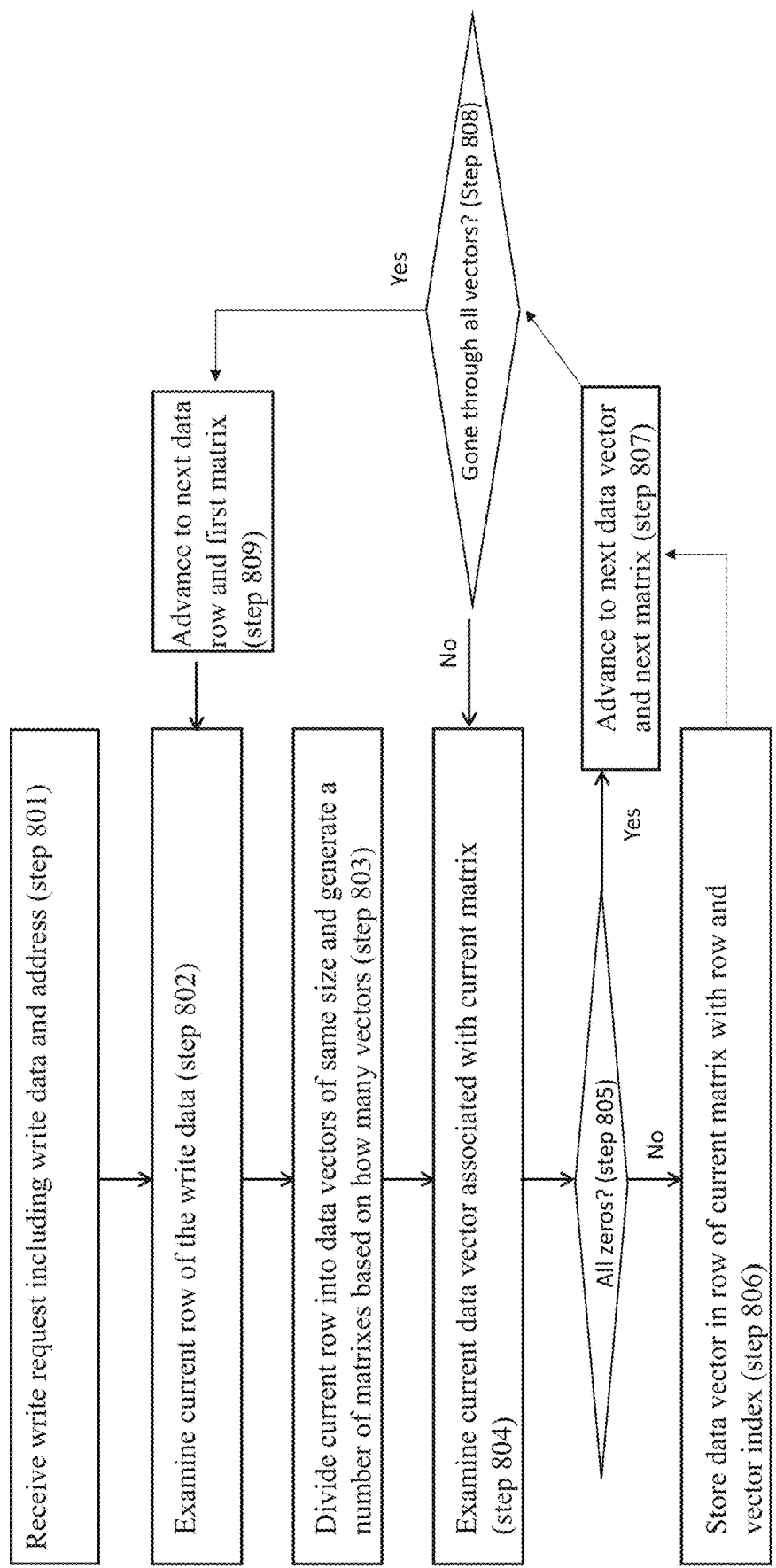

FIG. 9A

Algorithm 2: Snapshot Window Encoding

*De-Compressor*
(1) row_read ← 1; row_split ← 0; dec_row ← zero vector;
(2) For input rows i=1 to M
(3)  For matrix_num=1 to N/w
(4)   If matrix_num ≤ row_split
(5)    vector ← read row: (row_read+1) of matrix matrix_num
(6)   Else
(7)    vector ← read row: row_read of matrix matrix_num
(8)   End If
(9)   If vector index=i
(10)    dec_row ← dec_row & route vector to offset wi
(11)    row_split ← matrix_num
(12)   If row_split = M
(13)    row_read ← row_read+1; row_split ← 0;
(14)   End If
(15)  End For
(16) End For
(17) dec_row ← zero vector;
(18) End For

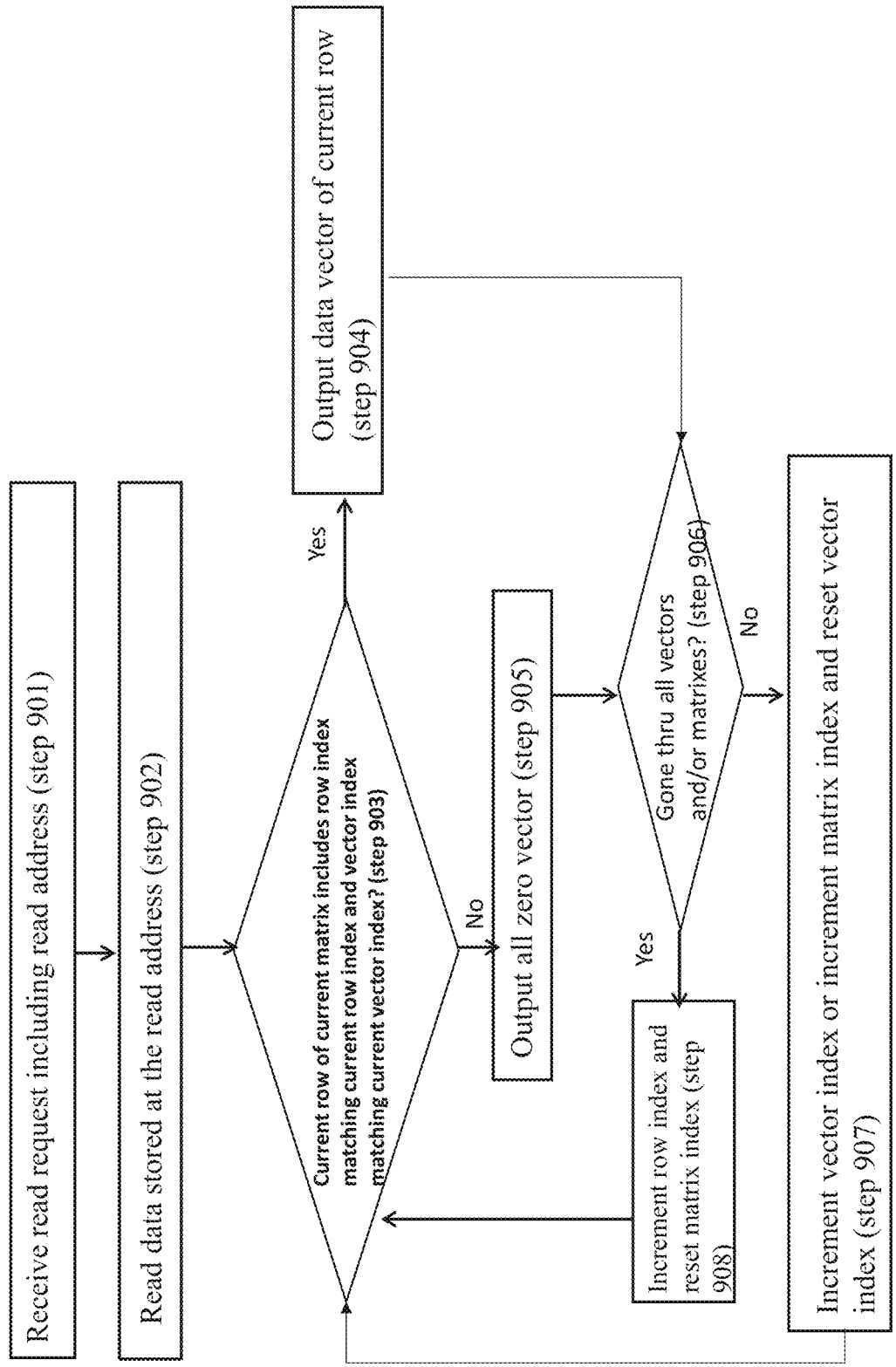

ECC BUFFER REDUCTION IN A MEMORY DEVICE

CROSS-REFERENCE TO RELATED APPLICATIONS

This application is a divisional application of U.S. patent application Ser. No. 17/223,375 filed Apr. 6, 2021, the disclosure of which is incorporated by reference herein in its entireties.

TECHNICAL FIELD

Exemplary embodiments of the present inventive concept relate to use of a buffer in a memory, and more particularly to use of the buffer to perform error checking and correction on data to be exchanged with a non-volatile memory.

DISCUSSION OF RELATED ART

A non-volatile memory is a type of computer memory that can retain stored information even after power is removed. Flash memory is an example of non-volatile memory. A non-volatile memory system typically includes a memory controller and a non-volatile memory (NVM).

The memory controller may include an error correction code (ECC) circuit to correct data that is about to be written to the NVM or correct data that is read from the NVM. The ECC circuit may use a buffer to temporarily store the data and any other information generated during error checking and correction. However, when the size of the buffer is large, the memory controller takes up a large amount of space. Further, it may take a long time to perform error checking and correction when the size of the buffer is too small. Thus, there is a need to reduce the size of the buffer without increasing the amount of time needed to perform error checking and correction.

SUMMARY

According to an exemplary embodiment of the inventive concept, a memory system is provided. The memory system includes a memory device and a memory controller. The memory controller includes an error correction code (ECC) circuit. The ECC circuit is configured to determine data rows of first write data that are not all zeros and store the determined data rows in buffer rows of a buffer along with corresponding row indexes. The memory controller is configured to write second data based on the buffer to the memory device.

According to an exemplary embodiment of the inventive concept a computer-implemented method for programming data to a memory system is provided. The method includes: a memory controller receiving a write request including first write data; an ECC circuit determining data rows of the first write data that are not all zero; the ECC circuit generating compressed data including the determined data rows and corresponding row indexes within the first write data; and the memory controller writing second write data based on the compressed data to the memory device.

According to an exemplary embodiment of the inventive concept, a computer-implemented method for reading data from a memory system is provided. The method includes: a memory controller receiving a read request including a read address from a host device; the memory controller reading first read data from a memory of the memory system based on the read address; an error correction code (ECC) circuit decompressing compressed data based on the first read data to generate second read data; and the memory controller outputting the second read data to the host device. The compressed data includes a plurality of rows, where each row includes data and a different stored row index.

BRIEF DESCRIPTION OF THE DRAWINGS

The above and other features of the present inventive concept will become more apparent by describing in detail exemplary embodiments thereof with reference to the accompanying drawings, in which:

FIG. 6A and FIG. 6B illustrate an ECC circuit according to an exemplary embodiment of the inventive concept.

FIG. 7A illustrates exemplary pseudocode for compressing and decompressing data according to an exemplary embodiment of the inventive concept.

FIG. 7C illustrates exemplary data compressed according to the compressing of FIG. 7A.

FIG. 7D illustrates a method of reading data using the decompressing of FIG. 7A according to an exemplary embodiment of the inventive concept.

FIG. 8A illustrates exemplary pseudocode for compressing data according to an exemplary embodiment of the inventive concept.

FIG. 8B illustrates a method of programming data using the compressing of FIG. 8A according to an exemplary embodiment of the inventive concept.

FIG. 9A illustrates exemplary pseudocode for decompressing data according to an exemplary embodiment of the inventive concept.

FIG. 9B illustrates a method of reading data using the decompressing of FIG. 9A according to an exemplary embodiment of the inventive concept

DETAILED DESCRIPTION

Figure 1:
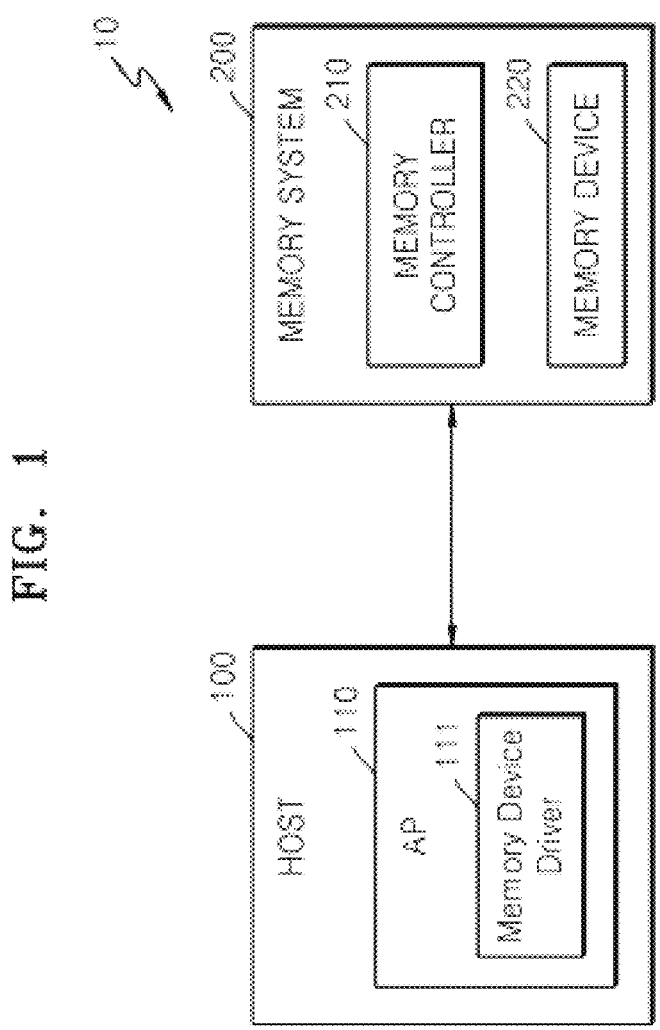
FIG. 1 is a block diagram illustrating an implementation of a data processing system including a memory system, according to an exemplary embodiment of the inventive concept.

Exemplary embodiments of the present inventive concept will be described more fully hereinafter with reference to the accompanying drawings. Like reference numerals may refer to like elements throughout the accompanying drawings.

It should be understood that descriptions of features or aspects within each exemplary embodiment should typically be considered as available for other similar features or aspects in other exemplary embodiments, unless the context clearly indicates otherwise.

As used herein, the singular forms "a", "an" and "the" are intended to include the plural forms as well, unless the context clearly indicates otherwise.

Herein, when one value is described as being about equal to another value or being substantially the same as or equal to another value, it is to be understood that the values are equal to each other to within a measurement error, or if measurably unequal, are close enough in value to be functionally equal to each other as would be understood by a person having ordinary skill in the art. For example, the term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations as understood by one of ordinary skill in the art. Further, it is to be understood that while parameters may be described herein as having "about" a certain value, according to exemplary embodiments, the parameter may be exactly the certain value or approximately the certain value within a measurement error as would be understood by a person having ordinary skill in the art.

FIG. 1 is a block diagram illustrating an implementation of a data processing system including a memory system, according to an exemplary embodiment of the inventive concept.

Referring to FIG. 1, the data processing system 10 may include a host 100 and a memory system 200. The memory system 200 shown in FIG. 1 may be utilized in various systems that include a data processing function. The various systems may be various devices including, for example, mobile devices, such as a smartphone or a tablet computer. However, the various devices are not limited thereto.

The memory system 200 may include various types of memory devices. Herein, exemplary embodiments of the inventive concept will be described as including a memory device that is a non-volatile memory. However, exemplary embodiments are not limited thereto. For example, the memory system 200 may include a memory device that is a volatile memory.

According to exemplary embodiments, the memory system 200 may include a non-volatile memory device such as, for example, a read-only memory (ROM), a magnetic disk, an optical disk, a flash memory, etc. The flash memory may be a memory that stores data according to a change in a threshold voltage of a metal-oxide-semiconductor field-effect transistor (MOSFET), and may include, for example, NAND and NOR flash memories. The memory system 200 may be implemented using a memory card including a non-volatile memory device such as, for example, an embedded multimedia card (eMMC), a secure digital (SD) card, a micro SD card, or a universal flash storage (UFS), or the memory system 200 may be implemented using, for example, an SSD including a non-volatile memory device. Herein, the configuration and operation of the memory system 200 will be described assuming that the memory system 200 is a non-volatile memory system. However, the memory system 200 is not limited thereto. The host 100 may include, for example, a system-on-chip (SoC) application processor (AP) mounted on, for example, a mobile device, or a central processing unit (CPU) included in a computer system.

As described above, the host 100 may include an AP 110. The AP 110 may include various intellectual property (IP) blocks. For example, the AP 110 may include a memory device driver 111 that controls the non-volatile memory system 200. The host 100 may communicate with the non-volatile memory system 200 to transmit a command (e.g., a read command, a write command, an erase command, etc.) related to a memory operation and receive a confirm command in response to the transmitted command.

The non-volatile memory system 200 may include, for example, a memory controller 210 and a memory device 220. The memory controller 210 may receive a command related to a memory operation from the host 100, generate an internal command and an internal clock signal using the received command, and provide the internal command and the internal clock signal to the memory device 220. The memory device 220 may store write data in a memory cell array in response to the internal command, or may provide read data to the memory controller 210 in response to the internal command.

Figure 4:
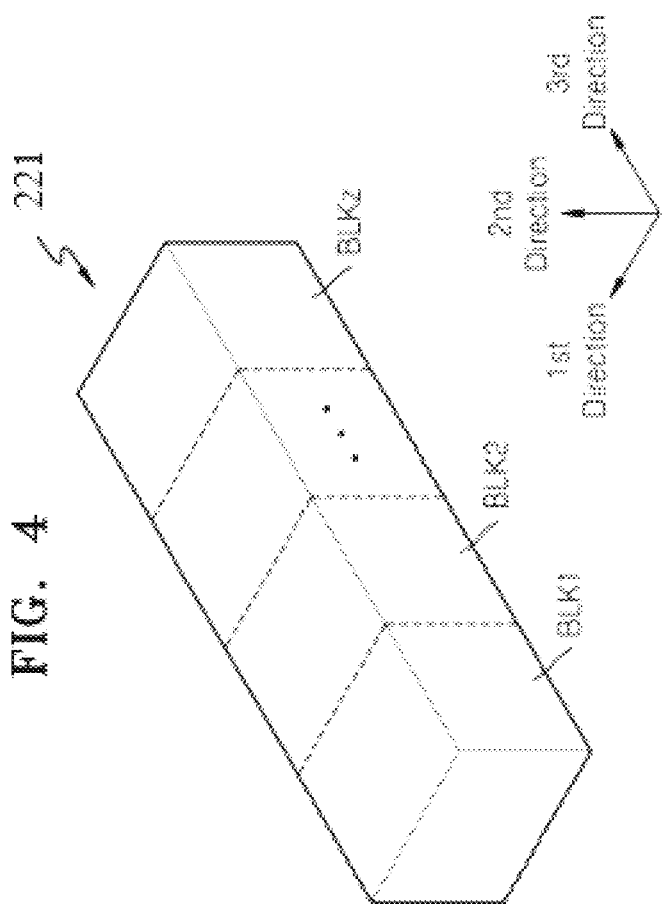
FIG. 4 is a block diagram of the memory cell array of FIG. 2, according to an exemplary embodiment of the inventive concept.

The memory device 220 may include a memory cell array that retains data stored therein, even when the memory device 220 is not powered on. The memory cell array may include as memory cells, for example, a NAND or NOR flash memory, a magnetoresistive random-access memory (MRAM), a resistive random-access memory (RRAM), a ferroelectric access-memory (FRAM), or a phase change memory (PCM). For example, when the memory cell array includes a NAND flash memory, the memory cell array may include a plurality of blocks and a plurality of pages. Data may be programmed and read in units of pages, and data may be erased in units of blocks. An example of memory blocks included in a memory cell array is shown in FIG. 4.

Figure 2:
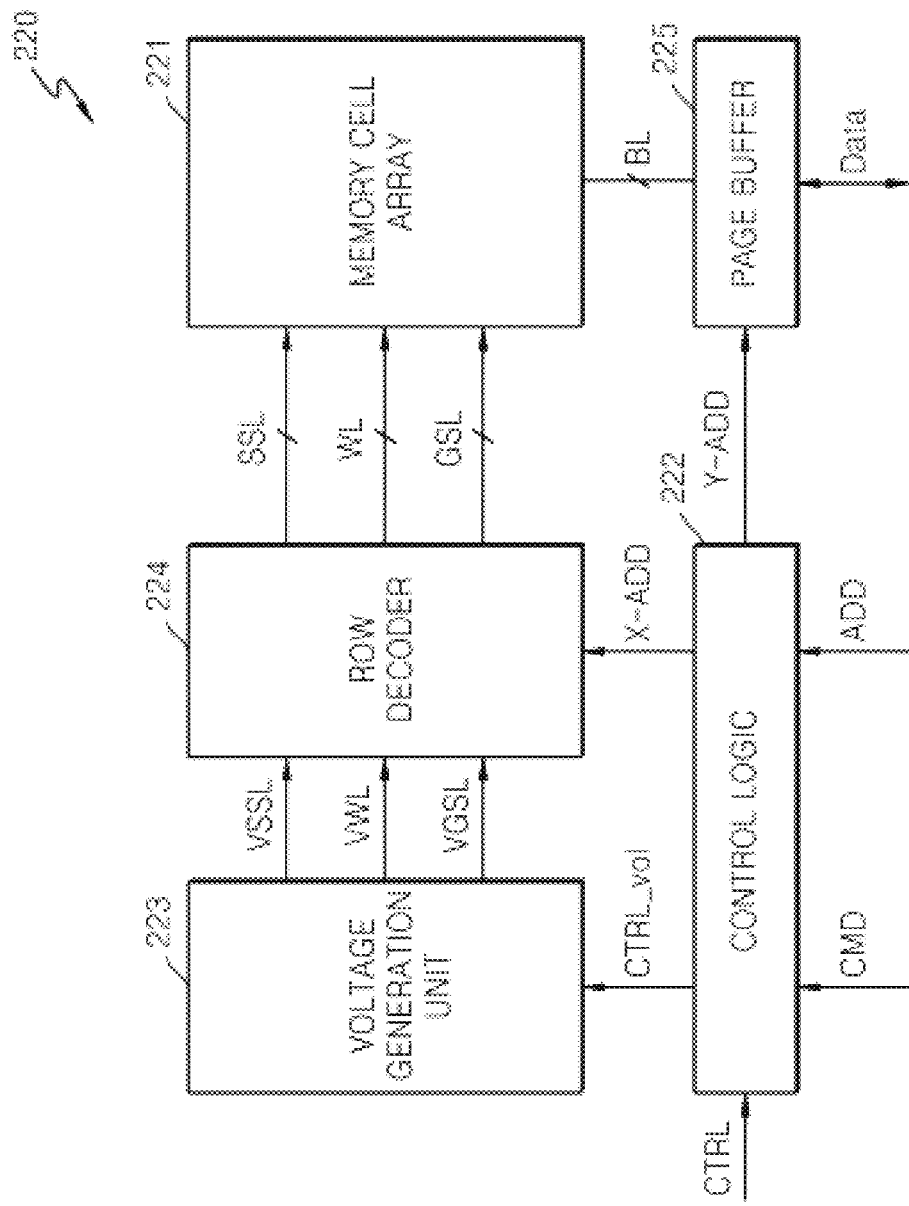
FIG. 2 is a detailed block diagram of a non-volatile memory device of FIG. 1, according to an exemplary embodiment of the inventive concept.

FIG. 2 is a detailed block diagram of the non-volatile memory device 220 of FIG. 1, according to an exemplary embodiment of the inventive concept.

Referring to FIG. 2, the non-volatile memory device 220 may include, for example, a memory cell array 221, a control logic 222, a voltage generation unit 223, a row decoder 224, and a page buffer 225.

The memory cell array 221 may be connected to one or more string select lines SSL, a plurality of word lines WL, one or more ground select lines GSL, and a plurality of bit lines BL. The memory cell array 221 may include a plurality of memory cells disposed at intersections between the plurality of word lines WL and the plurality of bit lines BL.

The control logic 222 may receive a command CMD (e.g., an internal command) and an address ADD from the memory controller 210 and receive a control signal CTRL for controlling various functional blocks within the non-volatile memory device 220 from the memory controller 210. The control logic 222 may output various control signals for writing data to the memory cell array 221 or reading data from the memory cell array 221, based on the command CMD, the address ADD, and the control signal CTRL. In this manner, the control logic 222 may control the overall operation of the memory device 220.

The various control signals output by the control logic 222 may be provided to the voltage generation unit 223, the row decoder 224, and the page buffer 225. For example, the control logic 222 may provide the voltage generation unit 223 with a voltage control signal CTRL_vol, provide the row decoder 224 with a row address X-ADD, and provide the page buffer 225 with a column address Y-ADD.

The voltage generation unit 223 may generate various voltages for performing program, read, and erase operations on the memory cell array 221 based on the voltage control signal CTRL_vol. For example, the voltage generation unit 223 may generate a first driving voltage VWL for driving the plurality of word lines WL, a second driving voltage VSSL for driving the plurality of string select lines SSL, and a third driving voltage VGSL for driving the plurality of ground select lines GSL. In this case, the first driving voltage VWL may be a program voltage (e.g., a write voltage), a read voltage, an erase voltage, a pass voltage, or a program verify voltage. In addition, the second driving voltage VSSL may be a string select voltage (e.g., an on voltage or an off voltage). Further, the third driving voltage VGSL may be a ground select voltage (e.g., an on voltage or an off voltage).

The row decoder 224 may be connected to the memory cell array 221 through the plurality of word lines WL, and may activate a part of the plurality of word lines WL in response to the row address X-ADD received from the control logic 222. For example, in a read operation, the row decoder 224 may apply a read voltage to a selected word line and a pass voltage to unselected word lines.

In a program operation, the row decoder 224 may apply a program voltage to a selected word line and a pass voltage to unselected word lines. In an exemplary embodiment, in at least one of a plurality of program loops, the row decoder 224 may apply the program voltage to the selected word line and an additionally selected word line.

The page buffer 225 may be connected to the memory cell array 221 through the plurality of bit lines BL. For example, in a read operation, the page buffer 225 may operate as a sense amplifier that outputs data stored in the memory cell array 221. Alternatively, in a program operation, the page buffer 225 may operate as a write driver that writes desired data to the memory cell array 221.

Figure 3:
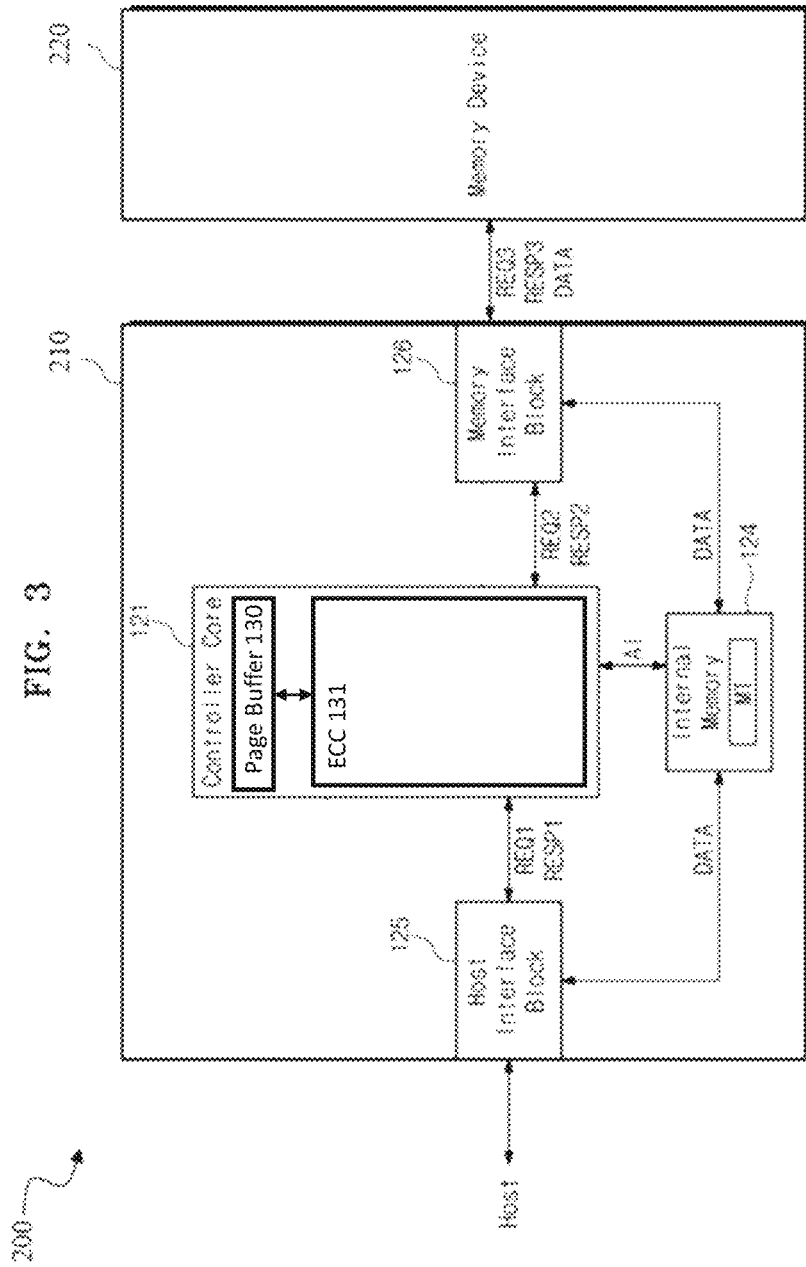
FIG. 3 is a block diagram illustrating the memory system of FIG. 1, according to an exemplary embodiment of the inventive concept.

FIG. 3 is a block diagram illustrating the memory system 200 of FIG. 1, according to an exemplary embodiment of the inventive concept.

Referring to FIG. 3, the memory system 200 includes the memory device 220 and the memory controller 210. The memory controller 210 may also be referred to herein as a controller circuit. The memory device 220 may perform a write operation, a read operation, or an erase operation under control of the memory controller 210.

The memory controller 210 may control the memory device 220 depending on a request received from the host 100 or an internally designated schedule. The memory controller 210 may include a controller core 121, an internal memory 124, a host interface block 125, and a memory interface block 126.

The controller core 121 may include a page buffer 130 and an ECC circuit 131. The controller core 121 may control and access the memory device 220 depending on a request received from the host 100 or an internally designated schedule. The controller core 121 may manage and execute various metadata and codes used to manage or operate the memory system 200. In an exemplary embodiment of the inventive concept, the ECC circuit 131 performs error detection and correction on read data read from memory cells of the memory device 220 or write data that is about to be written to the memory device. In an embodiment, the read data or the write data is temporarily stored in a buffer of the ECC circuit. The buffer may also be used to store information generated and used during the error detection and correction.

The controller core 121 may sense read voltages from a subset of the memory cells in response to a read command and address information received from a Host, convert the read voltages into a codeword (including data and redundancy information), and perform an ECC operation on the codeword using the ECC circuit 131.

The ECC circuit 131 may execute the ECC operation using a buffer of reduced sized as compared to prior techniques. In an exemplary embodiment in response to a write request from the Host, the ECC circuit 131 compresses write data, the ECC circuit 131 stores the compressed data in an internal buffer, the ECC circuit 131 encodes and error corrects the stored data to generate corrected data, and the controller core 121 writes the corrected data to the memory device 220. In an exemplary embodiment in response to a read request from the Host, the controller core 121 reads data from the memory device 220, the ECC circuit 131 decodes and error corrects the read data to generate error corrected data, the ECC circuit 131 decompresses the error corrected data, and the controller core 121 outputs the decompressed data to the Host. The compression and the decompression will be discussed in greater detail below.

The internal memory 124 may be used, for example, as a system memory which is used by the controller core 121, a cache memory which stores data of the memory device 220, or a buffer memory which temporarily stores data between the host 100 and the memory device 220. The internal memory 124 may additionally store a mapping table MT that indicates a relationship between logical addresses from the Host Device 100 assigned to the memory system 200 and physical addresses of the memory device 220. The internal memory 124 may include, for example, a dynamic random access memory (DRAM) or a static random access memory (SRAM). The internal memory 124 may include one or more buffers.

The host interface block 125 may include a component for communicating with the host 100 such as, for example, a physical block. The memory interface block 126 may include a component for communicating with the memory device 220 such as, for example, a physical block.

The host interface block 125 may provide the memory control core 122 with a first request REQ1 received from the host 100. The first request REQ1 may include a command (e.g., a read command or a write command) and a logical address. The memory control core 122 may translate the first request REQ1 to a second request REQ2 suitable for the memory device 220.

For example, the controller core 121 may translate a format of the command. The controller core 121 may obtain address information AI with reference to the mapping table MT stored in the internal memory 124. The controller core 121 may translate a logical address to a physical address of the memory device 220 by using the address information AI. The controller core 121 may provide the second request REQ2 suitable for the memory device 220 to the memory interface block 126.

The memory interface block 126 may register the second request REQ2 from the controller core 121 at a queue. The memory interface block 126 may transmit a request that is first registered at the queue to the memory device 220 as a third request REQ3.

When the first request REQ1 is a write request, the host interface block 125 may write data received from the host 100 to the internal memory 124. When the third request REQ3 is a write request, the memory interface block 126 may transmit data stored in the internal memory 124 to the memory device 220.

When data is completely written, the memory device 220 may transmit a third response RESP3 to the memory interface block 126. In response to the third response RESP3, the memory interface block 126 may provide the controller core 121 with a second response RESP2 indicating that the data is completely written.

After the data is stored in the internal memory 124 or after the second response RESP2 is received, the controller core 121 may transmit a first response RESP1 indicating that the request is completed to the host 100 through the host interface block 125.

When the first request REQ1 is a read request, the read request may be transmitted to the memory device 220 through the second request REQ2 and the third request REQ3. The memory interface block 126 may store data received from the memory device 220 in the internal memory 124. When data is completely transmitted, the memory device 220 may transmit the third response RESP3 to the memory interface block 126.

As the third response RESP3 is received, the memory interface block 126 may provide the controller core 121 with the second response RESP2 indicating that the data is completely stored. As the second response RESP2 is received, the controller core 121 may transmit the first response RESP1 to the host 100 through the host interface block 125.

The host interface block 125 may transmit data stored in the internal memory 124 to the host 100. In an exemplary embodiment, in the case in which data corresponding to the first request REQ1 is stored in the internal memory 124, the transmission of the second request REQ2 and the third request REQ3 may be omitted.

Figure 5:
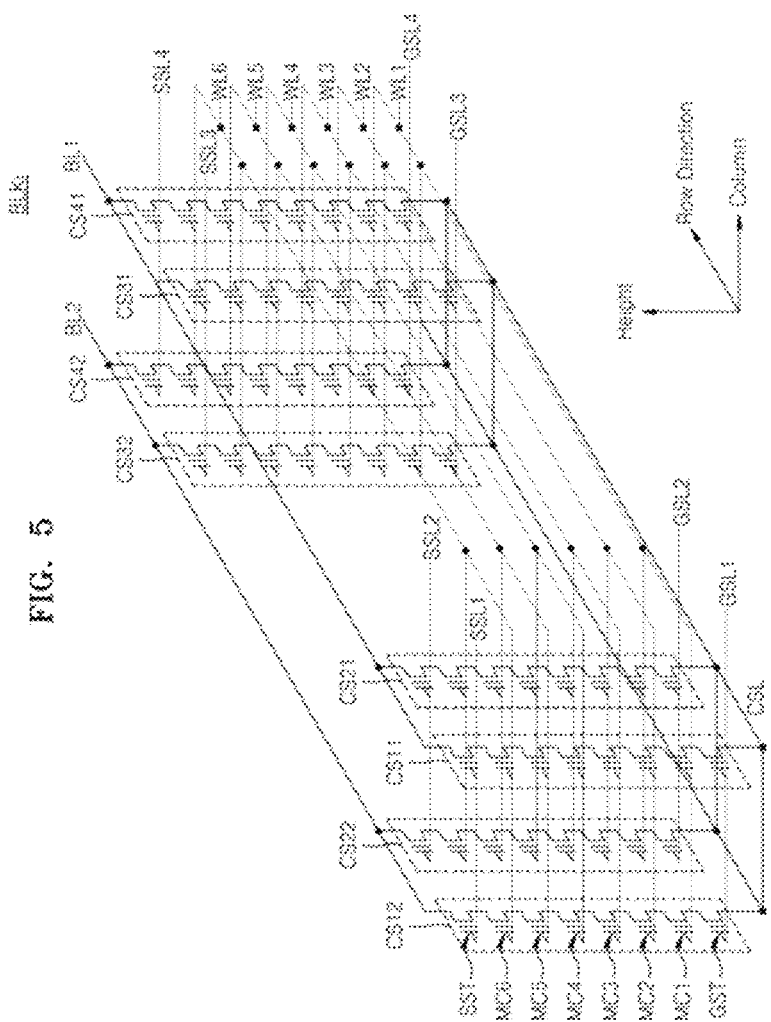
FIG. 5 is a circuit diagram of a memory block of the memory cell array of FIG. 4, according to an exemplary embodiment of the inventive concept.

FIGS. 4 and 5 illustrate an example in which the memory system 200 is implemented using a three-dimensional flash memory. The three-dimensional flash memory may include three-dimensional (e.g., vertical) NAND (e.g., VNAND) memory cells. An implementation of the memory cell array 221 including three-dimensional memory cells is described below. Each of the memory cells described below may be a NAND memory cell.

FIG. 4 is a block diagram of the memory cell array 221 of FIG. 2, according to an exemplary embodiment of the inventive concept.

Referring to FIG. 4, the memory cell array 221 according to an exemplary embodiment includes a plurality of memory blocks BLK1 to BLKz. Each of the memory blocks BLK1 to BLKz has a three-dimensional structure (e.g., a vertical structure). For example, each of the memory blocks BLK1 to BLKz may include structures extending in first to third directions. For example, each of the memory blocks BLK1 to BLKz may include a plurality of NAND strings extending in the second direction. The plurality of NAND strings may be provided, for example, in the first to third directions.

Each of the NAND strings is connected to a bit line BL, a string select line SSL, a ground select line GSL, word lines WL, and a common source line CSL. That is, each of the memory blocks BLK1 to BLKz may be connected to a plurality of bit lines BL, a plurality of string select lines SSL, a plurality of ground select lines GSL, a plurality of word lines WL, and a common source line CSL. The memory blocks BLK1 to BLKz will be described in further detail below with reference to FIG. 5.

FIG. 5 is a circuit diagram of a memory block BLKi according to an exemplary embodiment of the inventive concept. FIG. 5 illustrates an example of one of the memory blocks BLK1 to BLKz in the memory cell array 221 of FIG. 4.

The memory block BLKi may include a plurality of cell strings CS11 to CS41 and CS12 to CS42. The plurality of cell strings CS11 to CS41 and CS12 to CS42 may be arranged in column and row directions to form columns and rows. Each of the cell strings CS11 to CS41 and CS12 to CS42 may include a ground select transistor GST, memory cells MC1 to MC6, and a string select transistor SST. The ground select transistor GST, the memory cells MC1 to MC6, and the string select transistor SST, which are included in each of the cell strings CS11 to CS41 and CS12 to CS42, may be stacked in a height direction substantially perpendicular to a substrate.

The columns of the plurality of cell strings CS11 to CS41 and CS12 to CS42 may be connected to different string select lines SSL1 to SSL4, respectively. For example, the string select transistors SST of the cell strings CS11 and CS12 may be commonly connected to the string select line SSL1. The string select transistors SST of the cell strings CS21 and CS22 may be commonly connected to the string select line SSL2. The string select transistors SST of the cell strings CS31 and CS32 may be commonly connected to the string select line SSL3. The string select transistors SST of the cell strings CS41 and CS42 may be commonly connected to the string select line SSL4.

The rows of the plurality of cell strings CS11 to CS41 and CS12 to CS42 may be connected to different bit lines BL1 and BL2, respectively. For example, the string select transistors SST of the cell strings CS11 to CS41 may be commonly connected to the bit line BL1. The string select transistors SST of the cell strings CS12 to CS42 may be commonly connected to the bit line BL2.

The columns of the plurality of cell strings CS11 to CS41 and CS12 to CS42 may be connected to different ground select lines GSL1 to GSL4, respectively. For example, the ground select transistors GST of the cell strings CS11 and CS12 may be commonly connected to the ground select line GSL1. The ground select transistors GST of the cell strings CS21 and CS22 may be commonly connected to the ground select line GSL2. The ground select transistors GST of the cell strings CS31 and CS32 may be commonly connected to the ground select line GSL3. The ground select transistors GST of the cell strings CS41 and CS42 may be commonly connected to the ground select line GSL4.

The memory cells disposed at the same height from the substrate (or the ground select transistors GST) may be commonly connected to a single word line, and the memory cells disposed at different heights from the substrate may be connected to different word lines WL1 to WL6, respectively. For example, the memory cells MC1 may be commonly connected to the word line WL1. The memory cells MC2 may be commonly connected to the word line WL2. The memory cells MC3 may be commonly connected to the word line WL3. The memory cells MC4 may be commonly connected to the word line WL4. The memory cells MC5 may be commonly connected to the word line WL5. The memory cells MC6 may be commonly connected to the word line WL6. The ground select transistors GST of the cell strings CS11 to CS41 and CS12 to CS42 may be commonly connected to the common source line CSL.

Figure 6A:
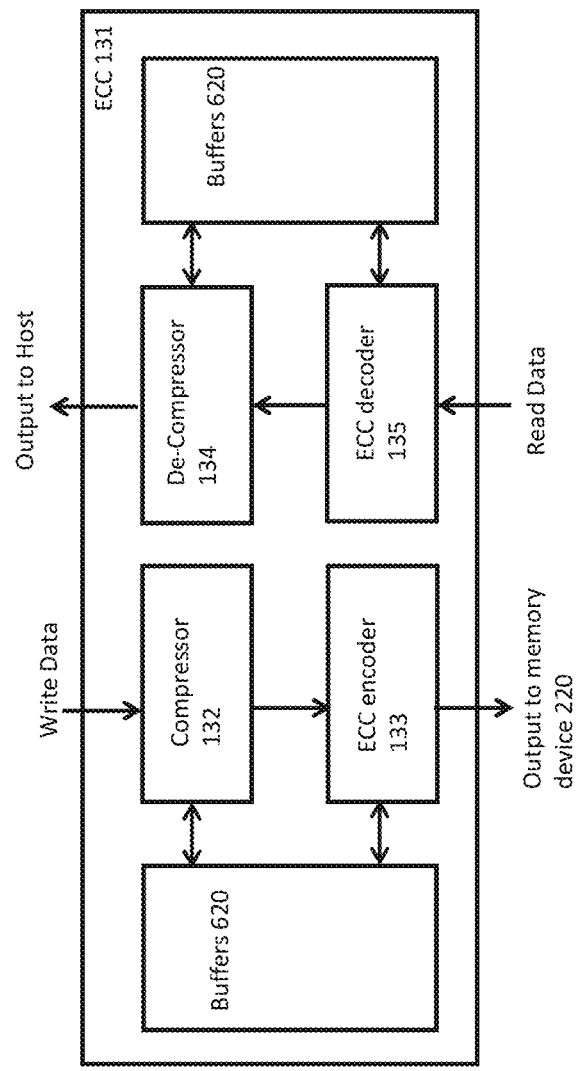

FIG. 6A and FIG. 6B illustrate the ECC circuit 131 according to an exemplary embodiment of the inventive concept. Referring to FIG. 6A, the ECC circuit 131 includes a compressor 132, an ECC encoder 133, a de-compressor 134, an ECC decoder 135, and buffers 620. Data to be written to the memory device 220 is compressed using the compressor 132, the compressed data is stored in a buffer of the buffers 620, the buffered data is then encoded and error corrected using the ECC encoder 133 to generate corrected data for output to the memory device 220. Data read from the memory device is decoded and error corrected using the ECC decoder 135 to generate corrected data, the corrected data is decompressed using the de-compressor 134, and the de-compressed data is output to the Host.

Part a of FIG. 6B shows a periphery circuit 600 interfacing with a buffer having N columns (e.g., N may be a positive integer greater than 1) and M rows (e.g., M may be a positive integer greater than 1). For example, the periphery circuit 600 could be the Host Interface Block. Part b of FIG. 6B shows that once an embodiment of the inventive concept is adopted, the periphery circuit 600 may interact with a buffer 620-1 among the buffers 620 of a reduced size due to the compressor 132 and the de-compressor 134. The buffer 620-1 includes N' columns and M' rows. In an embodiment, N' is the same as N but M' is less than M.

Figure 7B:
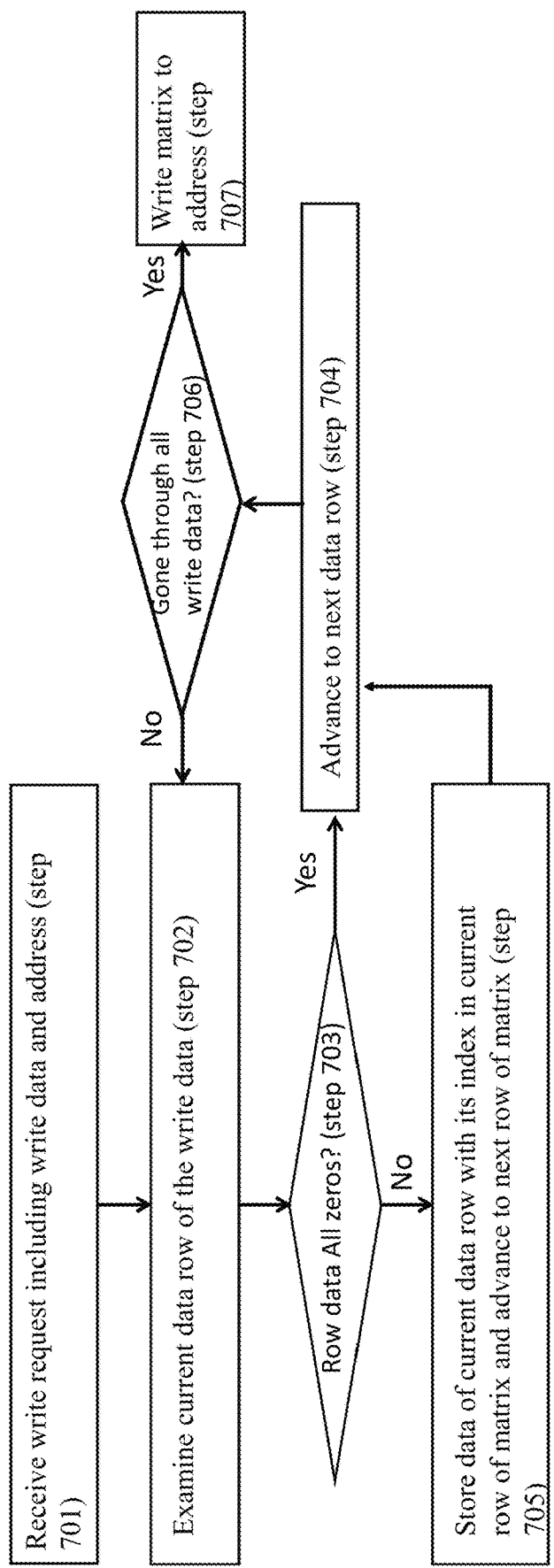
FIG. 7B illustrates a method of programming data using the compressing of FIG. 7A according to an exemplary embodiment of the inventive concept.

FIG. 7A illustrates pseudocode for compressing data that is to be written to memory and decompressing data that is read from memory, according to an exemplary embodiment of the disclosure. FIG. 7B illustrates a method of writing data that may use the compression of FIG. 7A according to an exemplary embodiment of the disclosure. FIG. 7C illustrates an example of the compressed data that may be generated by the compressing of FIG. 7A. FIG. 7D illustrates a method of reading compressed data from memory that may use the decompression of FIG. 7A.

The method of FIG. 7B includes receiving a write request including write data and a write address (step 701). For example, the host interface block 125 of FIG. 3 may receive the write request from the Host. The write data may be temporarily stored in the page buffer 130.

The method of FIG. 7B further includes examining a current data row of the write data (step 702). The examining of the current data row may correspond to line 2 of the compressor pseudocode of FIG. 7A that references parameter i. For example, i=1 when the first data row of the write data is referenced during a first pass through the compressor pseudocode, i=2 when the second data row of the write data is referenced during a second pass through the compressor pseudocode, etc.

The method of FIG. 7B further includes determining whether the current row data is all zeros (step 703). For example, the compressor 132 could compare the row data of a first row of the page buffer 130 to an all zero vector to determine whether the current row data is all zeros. Line 3 of the compressor code of FIG. 7A represents the compare.

The method of FIG. 7B advances to a next data row if the row data is all zeros (step 704); but stores data of the current data row with its index in a current row of a data matrix, advances to a next row of the data matrix, and executes step 704 if the row data is determined not to be all zeros (step 705). Lines 4 and 5 of the compressor code of FIG. 7A represents the storing of the data and the advancing, and parameter j in line 1 of the compressor code represents a row of the matrix. For example, if the write data includes first row data that is not all zeros, second row data that is all zeros, and third row data that is not all zeros, the first (i.e., j=1) row of the data matrix would include the first row data and an index of 1 (i.e., i=1) and the second (i.e., j=1) row of the data matrix would include the third row data and an index of 3 (i.e., i=3). In an embodiment, the data matrix is buffer 620-1. The parameter i may be incremented to advance to the next data row and the parameter j may be incremented to advance to the next row of the data matrix.

After advancing to the next data row, the method of FIG. 7B includes determining whether all data of the write data has been gone through (step 706). If all the data has not been gone through (e.g., there is another row of write data), the method resumes to step 702. If all the data has been gone through, the method of FIG. 7B writes the data matrix to the write address (step 707). For example, the controller core 121 may write the data matrix to the memory device 220. In an exemplary embodiment, the ECC encoder 133 encodes and error corrects the data matrix to generate corrected data, and the controller 121 writes the corrected data to the memory device 220. Since the data matrix does not include the zero rows of data, the size the data matrix is smaller than the size of original data stored in the pager buffer 130. Thus, the write data stored within the memory device 220 may be referred to as compressed data.

FIG. 7C includes an example of original write data including 8 rows of data being compressed into compressed data of 4 rows since the original data includes 4 rows of data that are all zeros. For example, the first row of the compressed data includes the first row of the original data and its row index of 1, the second row of the compressed data includes the fourth row of the original data and its row index of 4, the third row of the compressed data includes the sixth row of the original data and its row index of 6, and the fourth row of the compressed data includes the eighth row of the original data and its row index of 8.

FIG. 7D illustrates a method of reading back the compressed data according to an exemplary embodiment of the disclosure. The method of FIG. 7D will be discussed with respect to the compressed data of FIG. 7C.

The method of FIG. 7D includes receiving a read request including a read address (step 711). For example, the controller core 121 could receive the read request from the Host through the Host Interface block 125.

The method of FIG. 7D further includes reading data stored at the read address (step 712). For example, the controller core 121 could read the compressed data of FIG. 7C from a location of the memory device 220 associated with the read address.

The method of FIG. 7D further includes determining whether a current row of the read data includes a stored row index that matches a current row index of the original data (step 713). In an embodiment, prior to performing step S713, the ECC decoder 135 performs a decoding and error correction operation on the read data to generate corrected read data, and step 713 is performed on the corrected read data.

The method of FIG. 7D further includes, outputting an all zero vector (step 714) and incrementing the current row index (step 715), if the match does not occur; and outputting data of the current row (step 716) and incrementing the current row index (step 715), if the match occurs. For example, if the current row of the read data is the first row and the current row index is 1, then the corresponding stored row index 1 of the compressed data matches the current row index, and the data of 0101010101 would be output and the current row index is incremented to 2. Since the current row index is 2, step 713 would next determine that the stored row index 4 of the second row of the compressed data does not match the current row index of 2, thereby causing output of all zero vector of 0000000000 and incrementing of the current row index to 3. The method of FIG. 7D continues until all rows of the compressed data have been processed. Each data row output by step S716 may be stored temporarily in buffer 620-1 until the decompression has completed, and the resulting decompressed data may then be output to the Host.

FIG. 8A illustrates pseudocode for compressing data according to an embodiment of the disclosure, and FIG. 8B illustrates a method of writing data according to an embodiment of the disclosure that may use the compressing of FIG. 8A.

The method of FIG. 8B includes receiving a write request including write data and a write address (step 801). For example, the controller core 121 may receive the write request from the Host through the Host Interface Block 125.

The method of FIG. 8B further includes examining a current data row of the write data (step 802). Line 2 of the pseudocode of FIG. 8A may correspond to examining of the current data row.

The method of FIG. 8B further includes dividing the current row into data vectors of the same size and generating a number of matrixes based on how many vectors (step 803). For example, if the current data row has 8 bits of data, it could be divided into 2 vectors of size 4, and then the number of matrixes would be 2. However, embodiments of the inventive concept are not limited thereto as the current data row may be divided into more than 2 vectors and the size of the vectors may be larger than 4 bits.

The method of FIG. 8B further includes examining the current data vector associated with the current matrix (step 804). For example, if the current data row was divided into two data vectors, this step examines one of the two data vectors.

The method of FIG. 8B further includes determining whether the current data vector is all zeros (step 805). The method of FIG. 8B includes storing the current data vector in the current matrix with its row and vector indexes (step 806) and advancing to a next data vector and next matrix (step 807), if the data vector is not all zeros; and only executing step 807 if the data vector is all zeros. The storing of the current data vector in a current matrix with its row and vector indexes may be performed by storing the same in a distinct row of buffer 620-1.

The method of FIG. 8B further includes determining whether all data vectors have been gone through (step 808). If not all data vectors of the current row have been gone through, the method resumes to step 804 with the next data vector and the next matrix.

If all the data vectors of the current data row have been gone through, then the method of FIG. 8B includes advancing to the next data row and to the first matrix (step 809) and resuming to step 802. Once all the data rows have been gone through, the method of FIG. 8B may further include writing the matrixes from buffer 620-1 to the memory device 220 as compressed data. In an exemplary embodiment, the data of the matrixes is first fed to the ECC encoder 133 for encoding and error correcting the data to generate corrected data, and the corrected data is written to a location of the memory device 220 associated with the write address.

Figure 8C:
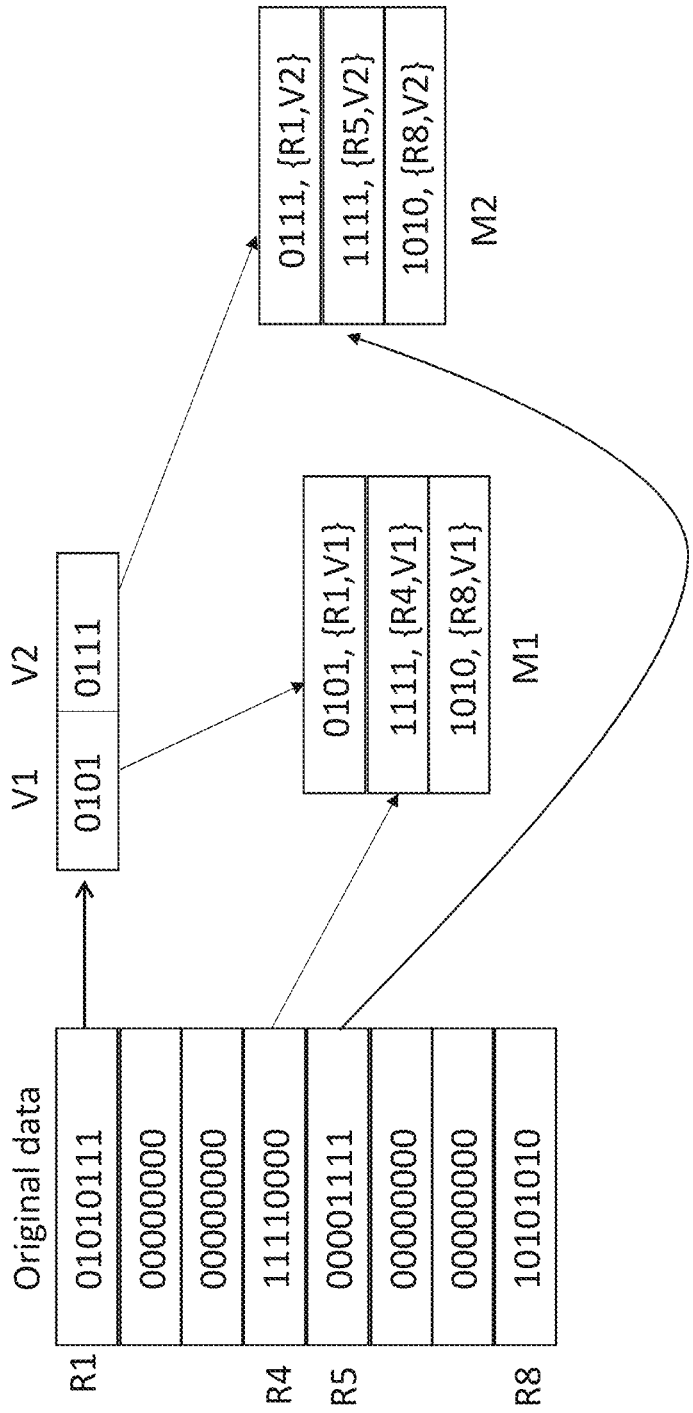
FIG. 8C illustrates exemplary data compressed according to the compressing of FIG. 8A.

FIG. 8C shows an example of the original write data being compressed into two matrixes. For example, when the method of FIG. 8B is applied to the original data of FIG. 8C, step 803 divides the 8-bit first row R1 of the original data into two data vectors V1 and V2 of size 4 and generates a first matrix M1 and a second matrix M2, step 806 outputs the first data vector V1, its row index R1, and its vector index V1 to a first row of the first matrix M1; and outputs the second data vector V2, its row index R1, and its vector index V2 to a first row of the second matrix. Since the second, third, sixth, and seventh rows of the original data are all zero, the matrixes M1 and M2 do not include any of their data. The first matrix M1 further includes the first four bits of the fourth row of the original data having row index R4 and the 4 most significant bits of the original data having row index R8. The second matrix M2 further includes the last four bits of the fifth row of the original data having row index R5 and the least significant bits of the fifth row. In an embodiment, the matrixes M1 and M2 are stored sequentially in buffer 620-1. For example, the first matrix M1 would correspond to first rows of the buffer 620-1 and the second matrix M2 would correspond to second rows of the buffer 620-1 that are sequentially adjacent to the first rows.

FIG. 9A illustrates pseudocode for de-compressing data according to an embodiment of the disclosure, and FIG. 9B illustrates a method of reading data according to an embodiment of the disclosure that may use the de-compressing of FIG. 9A.

The method of FIG. 9B includes receiving a read request including a read address (step 901). For example, the controller 121 could receive the read request from the Host through the Host Interface Block 125.

The method of FIG. 9B further includes reading data stored at the read address (step 902). For example, the controller core 121 could read data such as that stored in the matrixes M1 and M2 of FIG. 8C at a location of the memory device 220 corresponding to the read address. In an embodiment, the ECC decoder 135 performs decoding and error correction on the read data to generate corrected read data and the below steps 903-907 are performed on the corrected read data.

The method of FIG. 9B further includes determining whether a current row of a current matrix includes a stored row index that matches the current row index and a stored vector index that matches the current vector index (step 903). If both the stored row index and the stored vector index match, then the method of FIG. 9B includes outputting the data vector of the current row (step 904). If both the stored row index and the stored vector index do not match, then the method of FIG. 9B includes outputting an all zero vector (step 905). For example, with respect to FIG. 8C, if the current row index is R1, the current matrix is the first matrix M1, and the current data vector index is V1, both the stored row index and the stored vector index match, and the 0101 data would be output. For example, with respect to FIG. 8C, if the current row index is R2, the current matrix is the first matrix M1, and the current data vector index is V1, then the stored row index would not match and all zero data such as 0000 would be output.

The method of FIG. 9B further includes determining whether all vector and/or matrixes have been gone through (step 906). If not all vectors have been gone through, the method of FIG. 9B includes incrementing the vector index (step 907) and resuming to step 903. If all vectors have been gone through but not all matrixes have been gone through, the method of FIG. 9B includes incrementing the matrix index and resetting the vector index (step 907) and resuming to step 903. If all the vectors and all the matrixes have been gone through, the method of FIG. 9B includes incrementing the row index and resetting the matrix index (step 908) and resuming to step 903. Resetting a vector index means that the first vector index will be examined next and resetting a matrix index means that the first matrix index will be examined next.

The method of FIG. 9B continues until all the read or corrected read data has been decompressed and output. Each time step 904 or step 905 is executed, the corresponding output data may be stored in a corresponding row of the buffer 620-1 until the decompressing has completed, and then the resulting decompressed data may be output by the controller core 121 to the Host in response to the read request.

Figure 10:
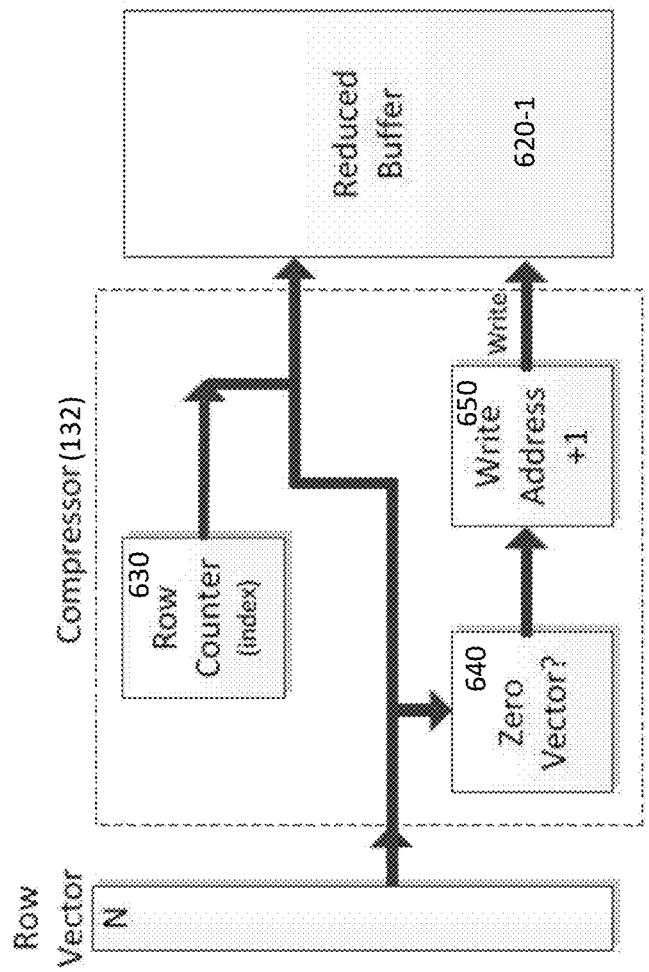
FIG. 10 illustrates a compressor according to an exemplary embodiment of the inventive concept.

FIG. 10 illustrates the compressor 132 according to an exemplary embodiment of the disclosure. Referring to FIG. 10, the compressor 132 includes a row counter 630 that is incremented each time a row of the original write data is analysed to generate a row index that is stored along with data of the row in a row of the buffer 620 when the data is non-zero. In an embodiment, the row counter 630 is a cyclic row counter that counts from 1 to the number M of rows within the original write data. At a start, all components of the compressor 132 may be reset to zero. Incoming rows may be input at a single clock cycle with row counter 630 indicating their index at the non-compressed buffer (e.g., the page buffer 130).

The data may be determined to be non-zero by comparing it to a zero vector 640. The comparing may be performed using a zero-vector comparator. The zero-vector comparator may include AND gates between all the vector bits. For example, when N vector bits are present, there may be N−1 AND gates in the vector comparator. In an embodiment, the row counter 630 has 0 to M−1 values and includes $\log_2 M$ flip-flops.

If the data of the row is not zero, the data is written to a current row of the buffer 620-1 along with the row index based on a write address and a write address logic 650 increments the write address. In an embodiment, the write address logic 650 includes $\log_2 M$ half adders, each with AND and XOR gates. If the data of the row is zero, the data is not written to the current row of the buffer 620-1 associated with the write address and the write address is not incremented.

Figure 11:
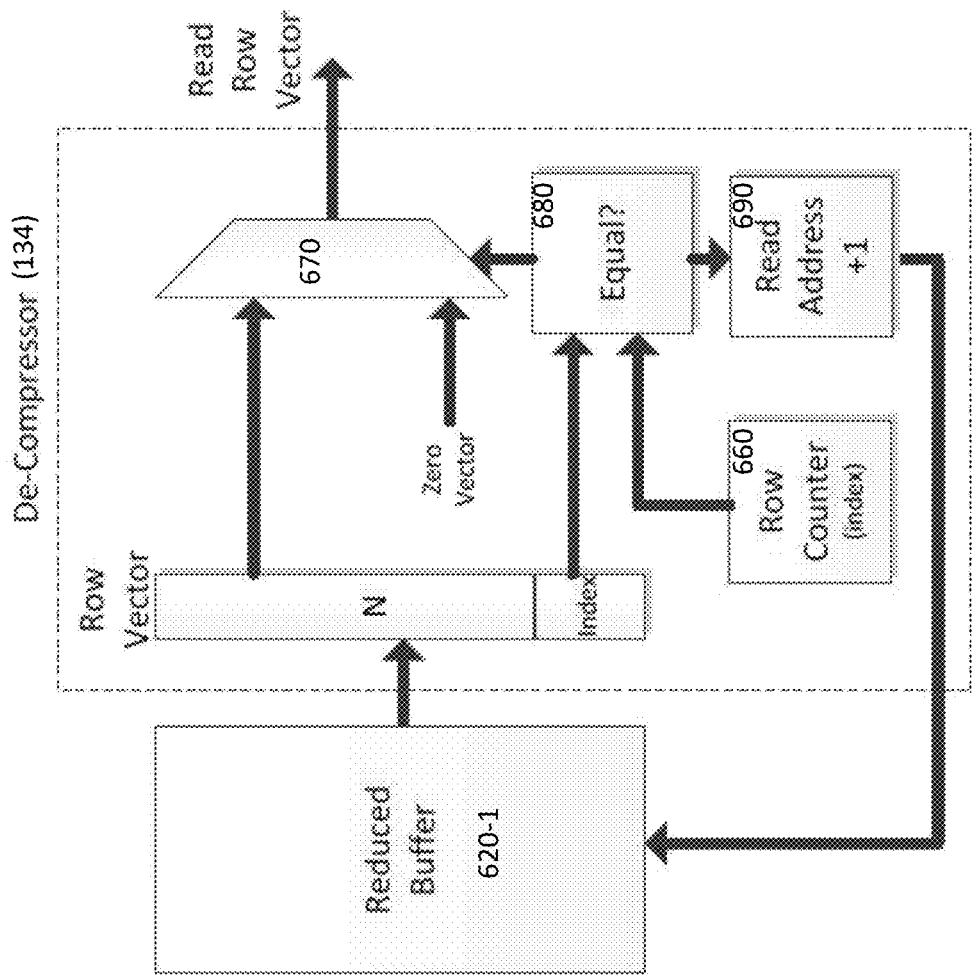
FIG. 11 illustrates a de-compressor according to an exemplary embodiment of the inventive concept.

FIG. 11 illustrates the de-compressor 134 according to an exemplary embodiment of the disclosure. Referring to FIG. 11, the de-compressor 134 includes a row counter 660, a multiplexer 670, compare logic 680, and a read address logic 690. The row counter 680 periodically increments a count to go through all rows of the original data. The compare logic 680 compares a count of the row counter 660 representing a current row of the original data to an index stored in a row of the buffer 620-1 associated with a current read address. If the count matches the stored index, the compare logic 680 outputs a first control signal of a first logic level to the multiplexer 670 indicating that the data of the row of the buffer should be output, and outputs a second control signal to the read address logic 690 to increment the read address. If the count does not match the stored index, the compare logic 680 outputs the first control signal of a second other logic level to the multiplexer 670 to output a zero vector.

Figure 12:
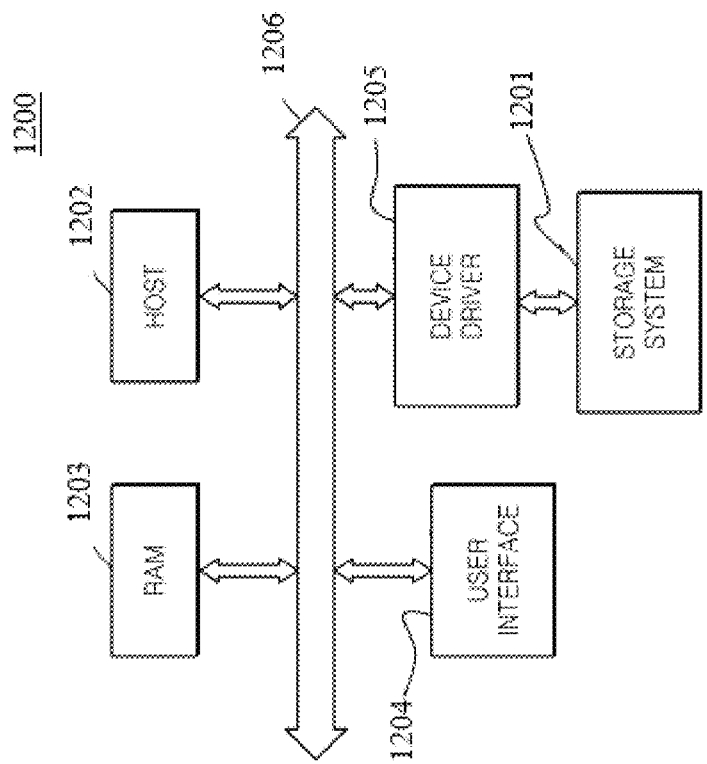
FIG. 12 is a block diagram of a computing system including a non-volatile memory system, according to an exemplary embodiment of the inventive concept.

FIG. 12 is a block diagram of a computing system 1200 including a non-volatile memory system, according to an exemplary embodiment of the inventive concept.

The non-volatile memory system in FIG. 12 may be the memory system 200 illustrated in FIG. 1. In the computing system 1200, which may be, for example, a mobile device or a desktop computer, the non-volatile memory system may be mounted as a non-volatile storage system 1201, however exemplary embodiments are not limited thereto.

The computing system 1200 may include, for example, a host 1202 including a CPU, a RAM 1203, a user interface 1204, and a device driver 1205. The host 1202 may be the host 100 illustrated in FIG. 1, and the device driver 1205 may be the memory device driver 111 illustrated in FIG. 1. These elements are electrically connected to a bus 1206. The non-volatile storage system 1201 may be connected to the device driver 1205. The host 1202 may control the entire computing system 1200 and perform an operation corresponding to a user command input through the user interface 1204. The RAM 1203 may function as a data memory of the host 1202. The host 1202 may write user data to or read user data from the non-volatile storage system 1201 through the device driver 1205. In FIG. 12, the device driver 1205 that controls the operation and management of the non-volatile storage system 1201 is illustrated as being disposed outside the host 1202, however exemplary embodiments are not limited thereto. For example, in an exemplary embodiment, the device driver 1205 may be disposed inside the host 1202.

In exemplary embodiments of the present inventive concept, a three-dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In exemplary embodiments of the present inventive concept, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

As is traditional in the field of the inventive concept, exemplary embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, etc., which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the exemplary embodiments may be physically separated into two or more interacting and discrete blocks, units and/or modules without departing from the scope of the inventive concept. Further, the blocks, units and/or modules of the exemplary embodiments may be physically combined into more complex blocks, units and/or modules without departing from the scope of the inventive concept.

Exemplary embodiments of the present invention may be embodied directly in hardware, in a software module executed by a processor, or in a combination of the two. A software module may be tangibly embodied on a non-transitory program storage device such as, for example, in RAM memory, flash memory, ROM memory, EPROM memory, EEPROM memory, registers, or any other form of storage medium known in the art. An exemplary storage medium may be coupled to the processor, such that the processor can read information from, and write information to, the storage medium. In the alternative, the storage medium may be integral to the processor. Further, in some aspects, the processor and the storage medium may reside in an application specific integrated circuit (ASIC).

While the present inventive concept has been particularly shown and described with reference to the exemplary embodiments thereof, it will be understood by those of ordinary skill in the art that various changes in form and detail may be made therein without departing from the spirit and scope of the present invention as defined by the following claims.

What is claimed is:

1. A computer-implemented method for reading data from a memory system, the method comprising:
   receiving, by the memory controller, a read request including a read address from a host device;
   reading, by the memory controller, first read data based on the read address;
   decompressing, by an error correction code (ECC) circuit, compressed data based on the first read data to generate second read data, wherein the compressed data includes a plurality of rows, where each row includes data and a different stored row index; and
   outputting, by the memory controller, the second read data to the host device,
   wherein the decompressing comprises for each of a plurality of original row indexes, outputting at least one all zero vector when the stored row index of one of the rows does not match the corresponding original row index.

2. The method of claim 1, wherein the decompressing comprises for each of the plurality of original row indexes, outputting data of one of the rows of the compressed data when the stored row index of the one row matches the corresponding original row index.

3. The method of claim 1, wherein the decompressing is performed by a multiplexer outputting one of an all zero vector and data of a row of the compressed data, in response to a control signal.

4. The method of claim 3, wherein the control signal is generated by comparing a current count of a row counter representing a current row among a plurality of rows of original data to the stored row index in one of the rows of the compressed data.

5. The method of claim 1, wherein the ECC circuit decodes and error corrects the first read data to generate the compressed data.

6. The method of claim 1, wherein each row further includes one of a plurality of stored data vector indexes.

7. A computer-implemented method for reading data from a memory system, the method comprising:
   receiving, by a memory controller, a read request including a read address from a host device;
   reading, by the memory controller, first read data based on the read address;
   decompressing, by an error correction code (ECC) circuit, compressed data based on the first read data to generate second read data, wherein the compressed data includes a plurality of rows, where each row includes data and a different stored row index; and
   outputting, by the memory controller, the second read data to the host device,
   wherein the ECC circuit decodes and error corrects the first read data to generate the compressed data.

8. The method of claim 7, wherein the decompressing comprises for each of a plurality of original row indexes, outputting data of one of the rows of the compressed data when the stored row index of the one row matches the corresponding original row index and otherwise outputting an all zero vector.

9. The method of claim 7, wherein the decompressing is performed by a multiplexer outputting one of an all zero vector and data of a row of the compressed data, in response to a control signal.

10. The method of claim 9, wherein the control signal is generated by comparing a current count of a row counter representing a current row among a plurality of rows of original data to the stored row index in one of the rows of the compressed data.

11. The method of claim 7, wherein each row further includes one of a plurality of stored data vector indexes.

12. A memory system, comprising:
    a memory device comprising a plurality of memory cells; and
    a memory controller comprising an error correction code (ECC) circuit,
    wherein the memory controller is configured to read first read data from the memory device, and
    wherein the ECC circuit is configured to decode and error correct the first read data to generate compressed data, the compressed data including a plurality of rows, where each row include data and a different stored row index,
    wherein the ECC circuit is further configured to decompress the compressed data based on the first read data to generate second read data, and
    wherein the memory controller is further configured to output the second read data to a host device.

13. The memory system of claim 12, wherein the ECC circuit decompresses the compressed data by outputting data in a current row of the compressed data when a row index in the current row matches a current row index and outputting an all zero vector when the row index does not match the current row index.

14. The memory system of claim 12, wherein the ECC circuit comprises:
    an ECC decoder configured to decode the compressed data; and
    a decompressor configured to decompress the first read data.

15. The memory system of claim 14, wherein the decompressor comprises:
    a buffer configured to store the compressed data and output a row associated with a current read address;
    a row counter configured to periodically increment a count;
    a compare logic configured to compare the count of the row counter and an index stored in the row associated with the current read address;
    a multiplexer configured to output one of an all zero vector and data stored in the row associated with the current read address based on a comparison result of the compare logic; and
    a read address logic configured to increment the current read address in response to the comparison result of the compare logic.

16. The memory system of claim 15, wherein the multiplexer outputs the all zero vector when the index stored in the row associated with the current read address does not match the count of the row counter, and outputs the data stored in the row associated with the current read address when the index stored in the row associated with the current read address matches the count of the row counter.

\* \* \* \* \*